(12) United States Patent
Maciorowski et al.

(10) Patent No.: US 8,214,702 B2
(45) Date of Patent: Jul. 3, 2012

(54) DISTRIBUTED JOINT TEST ACCESS GROUP TEST BUS CONTROLLER ARCHITECTURE

(75) Inventors: David Maciorowski, Longmont, CO (US); Christopher Shawn Kroeger, Longmont, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 21 days.

(21) Appl. No.: 12/614,512

(22) Filed: Nov. 9, 2009

(65) Prior Publication Data

US 2011/0113297 A1    May 12, 2011

(51) Int. Cl.
  *G01R 31/28*    (2006.01)
(52) U.S. Cl. ....................................... 714/727
(58) Field of Classification Search .......................... None
  See application file for complete search history.

(56) References Cited

U.S. PATENT DOCUMENTS

| | | | |
|---|---|---|---|
| 6,415,409 B1 * | 7/2002 | Rhodes et al. | 714/738 |
| 6,459,297 B1 * | 10/2002 | Smiley | 326/38 |
| 6,754,862 B1 * | 6/2004 | Hoyer et al. | 714/725 |
| 6,918,057 B1 * | 7/2005 | Brophy et al. | 714/30 |
| 6,948,147 B1 * | 9/2005 | New et al. | 716/117 |
| 7,078,929 B1 * | 7/2006 | Draper et al. | 326/16 |
| 7,155,711 B2 * | 12/2006 | Vogel et al. | 717/169 |
| 7,454,556 B1 * | 11/2008 | Knapp | 711/101 |
| 7,480,843 B1 * | 1/2009 | Jacobson | 714/725 |
| 7,505,331 B1 * | 3/2009 | Camarota | 365/189.08 |
| 7,550,995 B1 * | 6/2009 | Guilloteau et al. | 326/38 |
| 2002/0035658 A1 * | 3/2002 | Whetsel | 710/300 |
| 2004/0006729 A1 * | 1/2004 | Pendurkar | 714/733 |
| 2005/0246520 A1 * | 11/2005 | Vadi et al. | 713/100 |
| 2006/0200718 A1 * | 9/2006 | Halliday et al. | 714/727 |

\* cited by examiner

*Primary Examiner* — Guerrier Merant

(57) ABSTRACT

Apparatus and other embodiments associated with a distributed Joint Test Access Group (JTAG) test bus controller (TBC) architecture are described. One example method includes providing first on-board scan programming (OSP) data to a first circuit board configured with a first TBC and located in a computer. The example method also includes providing second OSP data to a second circuit board configured with a second test bus controller and located in the same computer. The example method also includes controlling OSP to be performed at least partially in parallel on the first circuit board and the second circuit board.

9 Claims, 4 Drawing Sheets

DISTRIBUTED JOINT TEST ACCESS GROUP TEST BUS CONTROLLER ARCHITECTURE

BACKGROUND

The Joint Test Access Group (JTAG) defined an architecture for performing boundary scanning on integrated circuits. The original architecture has been expanded to facilitate on-board scan programming (OSP) of programmable elements (e.g., programmable read only memory (PROM), field programmable gate array (FPGA)) on a circuit board in an apparatus (e.g., server). A JTAG architecture used for OSP has typically included one test bus controller (TBC) and one or more test access port (TAP) chains. If an apparatus (e.g., server) had more than one circuit board to be programmed using OSP, then a TAP chain typically spanned the multiple circuit boards.

As server complexity increased, as daisy chains of circuit boards to be controlled and/or programmed by JTAG based OSP lengthened, and as timing issues associated with the increasing complexity and daisy chain lengths became more difficult, JTAG based OSP became difficult, if even possible at all for some apparatus (e.g., enterprise servers). For example, flight time limits of long traces mandated slower clock speeds for JTAG based OSP operations. Just as clock speeds were being forced to go slower, the number of programmable elements to program using OSP was increasing, as was the size of the programmable elements. Additionally, using a single TBC required serial operation where one programmable element would be completely processed before processing of the next programmable element could be started. Programming a set of programmable devices could take an unacceptable amount of time due to the combination of slow clocks and serial operation.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
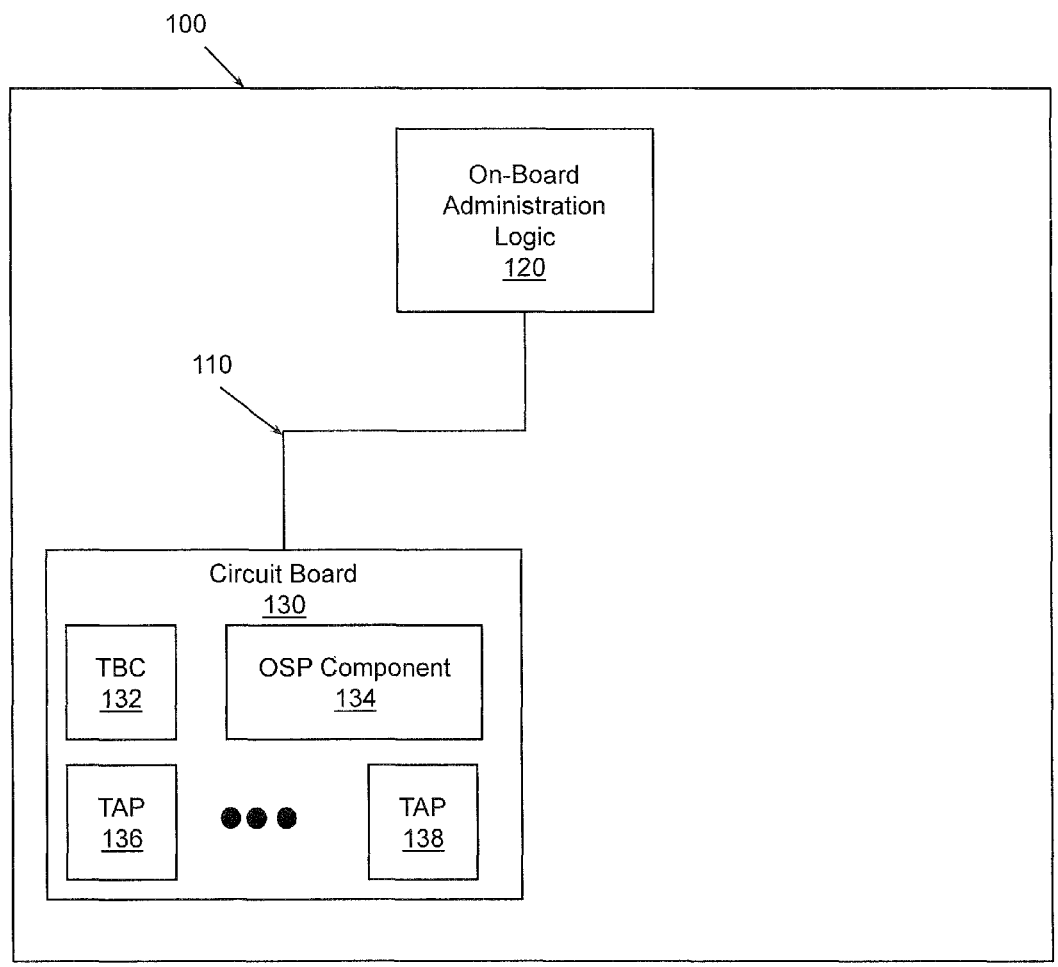
FIG. 1 illustrates one embodiment of an apparatus associated with a distributed JTAG TBC architecture.

Apparatus and methods associated with a distributed JTAG TBC architecture are described. The distributed JTAG TBC architecture may reside in a complex apparatus (e.g., enterprise class server). The complex apparatus may have a plurality of circuit boards. The circuit boards may have programmable elements to be programmed using OSP. Rather than employing the conventional serial approach that required slow clock speeds, example apparatus and methods employ a parallel approach and higher clock speeds. In one embodiment, the parallel approach and higher clock speeds are attainable by using more than one TBC and by limiting TAP chains to a single circuit board.

In one example, a TBC is placed on a circuit board having a programmable element to be programmed using OSP. Thus, if an enterprise class server has ten circuit boards that have programmable elements to be programmed using OSP, then example apparatus and methods would work with ten TBCs, one per circuit board. In the example, the ten TBCs are arranged one per circuit board, on the circuit board. In this configuration, a control logic could distribute control signals and data to the ten circuit boards via the ten TBCs, and then OSP could occur in parallel or at least partially in parallel on the ten circuit boards. The degree of parallelism achieved may depend, for example, on the distribution method employed to distribute the control signals and data. The degree of parallelism may also depend, for example, on the amount of time required to complete OSP for a programmable element on a circuit board.

The following includes definitions of selected terms employed herein. The definitions include various examples and/or forms of components that fall within the scope of a term and that may be used for implementation. The examples are not intended to be limiting. Both singular and plural forms of terms may be used within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations include physical manipulations of physical quantities. Usually, though not necessarily, the physical quantities take the form of electrical or magnetic signals capable of being stored, transferred, combined, compared, and otherwise manipulated in a logic, and so on. The physical manipulations transform electronic components and/or data from one state to another.

FIG. 1 illustrates an apparatus 100. Apparatus 100 forms part of a distributed Joint Test Access Group (JTAG) test bus controller (TBC) architecture. Apparatus 100 includes a circuit board 130. The circuit board 130 includes a programmable component 134 that can be programmed using JTAG on-board scan programming (OSP). In different examples the programmable component 134 can be a programmable read only memory (PROM), a field programmable gate array (FPGA), or other programmable device. The circuit board 130 includes a test bus controller (TBC) 132. In one example, the TBC 132 is configured to produce a set of JTAG OSP commands from scan information provided to the circuit board 130. Having produced the JTAG OSP commands, the TBC 132 can then provide the set of JTAG OSP commands to a TAP chain on circuit board 130 to control OSP of the programmable component 134. The TAP chain may include, for example, TAPs 136-138.

Apparatus 100 also includes an intra-complex management network 110. The intra-complex management network 110 is configured to communicate scan information between elements that provide scan information and elements that receive and use scan information. The scan information includes control signals and data associated with OSP of the programmable component 134 on circuit board 130. The scan information includes control signals that control how the programmable component 134 is to be dynamically programmed. The scan information also includes data that is programmed into the programmable component 134 using OSP. Unlike conventional systems, the scan information does not include JTAG commands, but instead includes encoded JTAG commands with an additional layer of abstraction. The encoded JTAG commands are configured to be translated into JTAG commands by the TBC.

Apparatus 100 also includes an on-board administration logic 120. The on-board administration logic 120 is configured to place the scan information on the intra-complex management network 110. Placing the scan information on the intra-complex management network 110 may include, for example, controlling a bus, controlling inter-process communications, controlling a network, and controlling other communications equipment and/or processes. In different embodiments, the on-board administration logic 120 can be (but is not limited to) hardware, firmware, instructions in execution on a machine, and/or combinations of each to perform a function(s) or an action(s), and/or to cause a function or action from another logic, method, apparatus, and/or system. Logic 120 may include a software controlled microprocessor, a discrete logic (e.g., ASIC), an analog circuit, a digital circuit, a programmed logic device, a memory device containing instructions, and so on. Logic 120 may include one or more gates, combinations of gates, or other circuit components. Other "logics" described herein may take forms similar to those described in connection with logic 120.

Circuit board 130 is configured to receive the scan information that is delivered from the on-board administration logic 120 via the intra-complex management network 110. The circuit board 130 includes one or more test access port(s) (TAP)s 136-138 that are arranged in a TAP chain that is confined to the circuit board 130. Being confined to a single circuit board, the TAP chain can be clocked at a rate faster than conventional JTAG systems. Therefore, in one example, apparatus 100 includes a JTAG clock that is configured to clock the TAP chain at a rate of at least 10 MHz. One skilled in the art will appreciate that 10 MHz is but one example and that other frequencies may be employed. On circuit board 130, the TBC 132 is configured as a host interface for the TAP chain 136-138, and at least one of the TAPs 136-138 is configured as a slave interface for the TAP chain 136-138. Therefore, one skilled in the art will appreciate that in one example the clock rate generated by the TBC is configurable to adapt to the maximum speeds of the TAPs in the chain(s) connected to a TBC.

Figure 2:
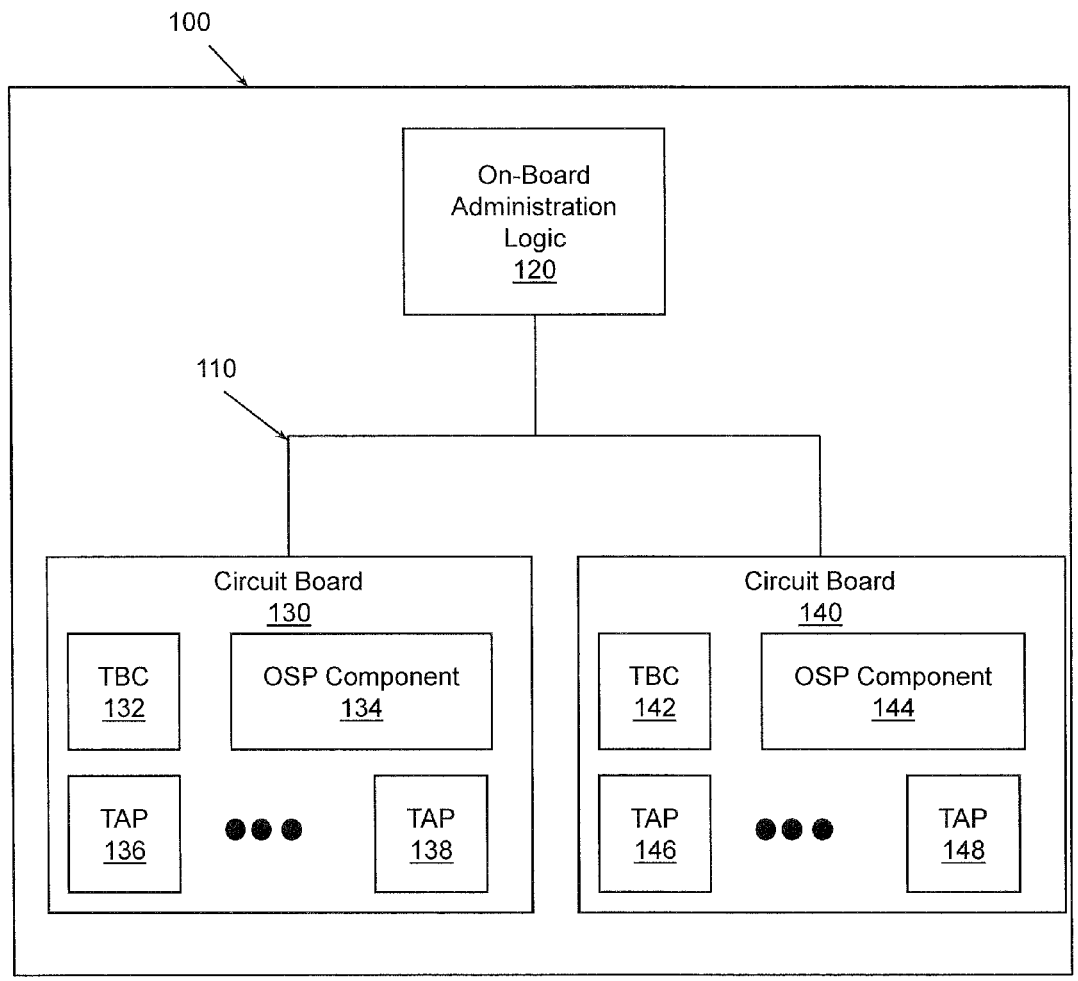
FIG. 2 illustrates one embodiment of an apparatus associated with a distributed JTAG TBC architecture.

FIG. 2 illustrates another embodiment of apparatus 100. In the embodiment illustrated in FIG. 2, apparatus 100 includes two circuit boards 130 and 140. While two circuit boards 130 and 140 are illustrated, one skilled in the art will appreciate that apparatus 100 can include more than two circuit boards. In the embodiment illustrated in FIG. 2, the on-board administration logic 120 is configured to provide scan information to the two circuit boards 130 and 140. The scan information may be distributed in parallel, substantially in parallel, and in other fashions. In one example, a complete set of scan information may be provided to circuit board 130 and then a complete set of scan information may be provided to circuit board 140. In another example, scan information may be made available to a set of circuit boards that can distinguish and accept scan information based on circuit board address. In other examples, scan information may be distributed in parts using a round-robin fashion, may be distributed in parts on an as-needed basis, or may be distributed using other distribution techniques.

In the embodiment illustrated in FIG. 2, the two circuit boards 130 and 140 are configured to perform OSP in parallel and/or substantially in parallel. Circuit board 130 may be configured to perform OSP independent of OSP performed on circuit board 140. By way of illustration, TBC 132 may receive scan information from on-board administration logic 120, may produce JTAG commands from the scan information, and then provide the JTAG commands to TAPs 136 through 138 to program programmable OSP component 134. Similarly, TBC 142 may receive scan information from on-board administration logic 120, may produce JTAG commands from the scan information, and then provide the JTAG commands to TAPs 146 through 148 to program programmable OSP component 144. Thus, one skilled in the art will appreciate that programmable component 134 and programmable component 144 can be programmed using OSP at the same time.

In conventional systems, programmable component 134 and programmable component 144 would have been subjected to OSP one after another (e.g., serially), rather than in parallel. Furthermore, due to timing constraints associated with the physical design of communication traces, communication lines, and other communication hardware, programmable component 134 and programmable component 144 would have been clocked at a slower rate than is possible on circuit board 130 and circuit board 140. Therefore, the apparatus 100 illustrated in FIG. 2 can achieve OSP of programmable component 134 and programmable component 144 faster than conventional systems.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

Figure 3:
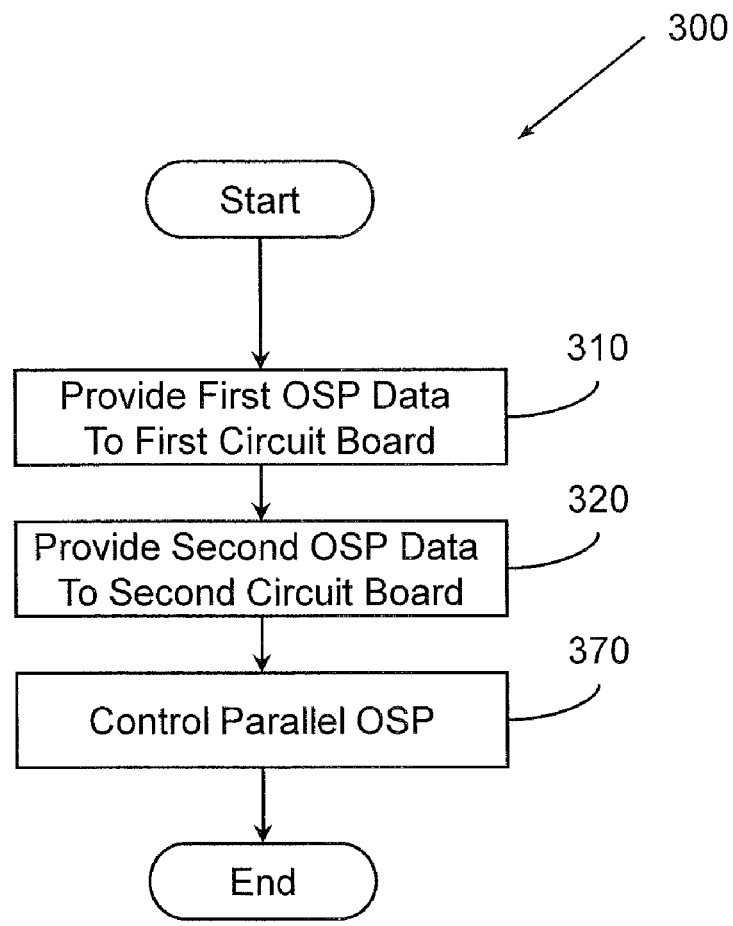
FIG. 3 illustrates one embodiment of a method for controlling OSP in a distributed JTAG TBC architecture.

FIG. 3 illustrates a method 300 associated with controlling a distributed JTAG TBC architecture. Method 300 includes, at 310, providing first OSP data to a first circuit board configured with a first TBC. The first circuit board is located in a computer (e.g., server). Method 300 also includes, at 320, providing second OSP data to a second circuit board configured with a second TBC. The second circuit board is located in the same computer (e.g., server) as the first circuit board. Note that both circuit boards are configured with their own TBCs. While method 300 describes communicating with a first circuit board and a second circuit board, one skilled in the art will appreciate that a greater number of circuit boards having programmable elements may reside in one machine (e.g., server) and that method 300 may therefore provide data to more than two circuit boards.

Method 300 also includes, at 370, controlling OSP to be performed at least partially in parallel on the first circuit board and the second circuit board. In one example, controlling OSP to be performed at least partially in parallel on the first circuit board and the second circuit board comprises providing a control signal to the first TBC and to the second TBC. The control signal may be a non-JTAG command provided with scan information. Once again, one skilled in the art will appreciate that in different embodiments method 300 can control more than two circuit boards to perform OSP in parallel.

Figure 4:
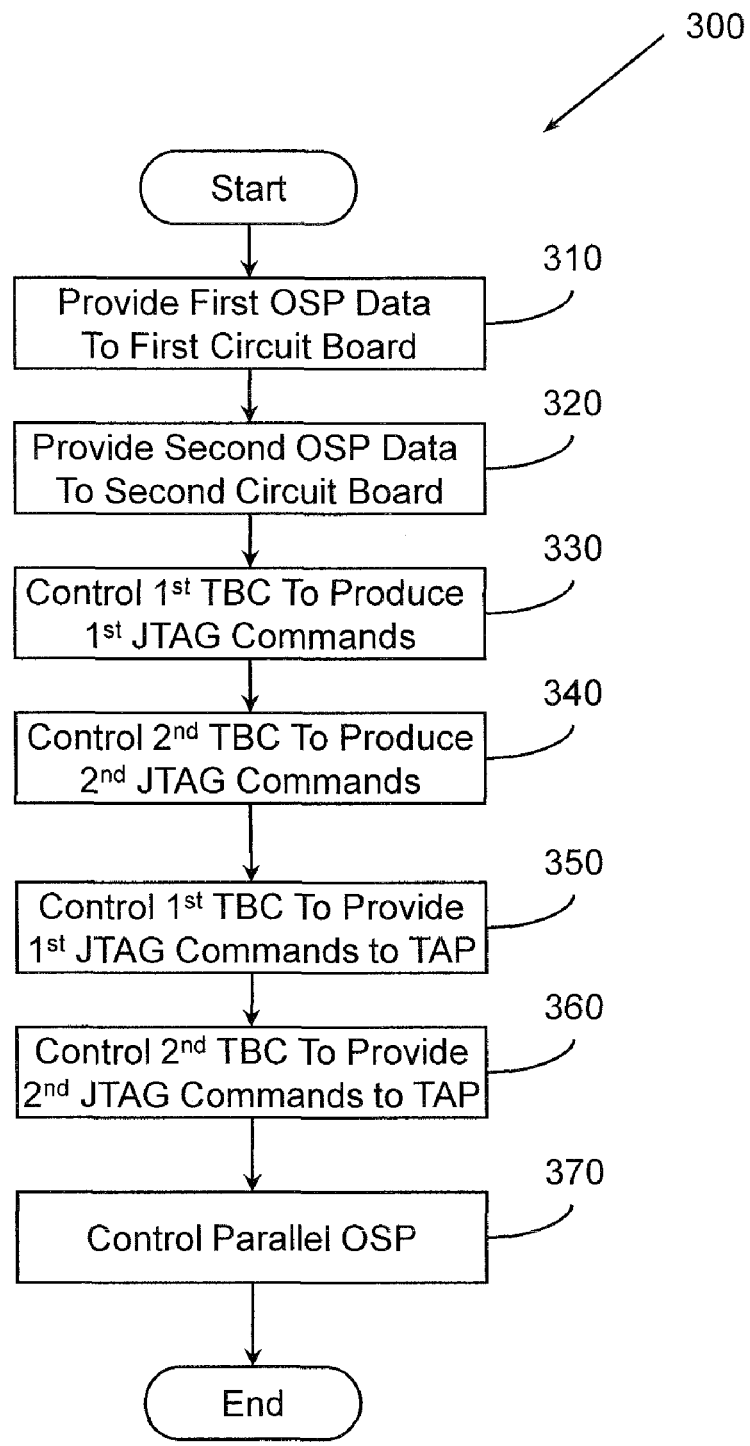
FIG. 4 illustrates one embodiment of a method for controlling OSP in a distributed JTAG TBC architecture.

FIG. 4 illustrates additional detail about method 300. For example, the embodiment of method 300 illustrated in FIG. 4 includes, at 330, controlling the first TBC to produce a first set of JTAG commands to control OSP on the first circuit board. This embodiment of method 300 also includes, at 340, controlling the second TBC to produce a second set of JTAG commands to control OSP on the second circuit board. The TBCs may accept non-JTAG scan information and produce JTAG commands.

Therefore, the embodiment of method 300 illustrated in FIG. 4 includes, at 350, controlling the first TBC to provide the first set of JTAG commands to a first TAP chain on the first circuit board. Similarly, the embodiment of method 300 illustrated in FIG. 4 includes, at 360, controlling the second TBC to provide the second set of JTAG commands to a second TAP on the second circuit board. With the two sets of JTAG commands generated by the two TBCs, programmable elements on the circuit boards can be subjected to OSP in parallel and/or substantially in parallel. Once again, one skilled in the art will appreciate that method 300 can communicate with and control more than two circuit boards configured with TBCs and TAP chains.

Apparatus 100 illustrates a distributed JTAG TBC architecture. Method 300 illustrates controlling a distributed JTAG TBC architecture. Apparatus 100 and method 300 therefore illustrate means for providing OSP data to a plurality of circuit boards arranged in a server, where an individual circuit board includes a TBC, a TAP, and an OSP programmable element. Additionally, apparatus 100 and method 300 provide means for controlling the plurality of circuit boards to perform OSP, in parallel, to program programmable elements on the plurality of circuit boards. In different embodiments the means include, but are not limited to, processes in execution, communication networks, and circuits.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. An apparatus, comprising:
an intra-complex management network to communicate first scan information and second scan information in a distributed Joint Test Access Group (JTAG) test bus controller (TBC) architecture;
on-board administration logic to place the first scan information and the second scan information on the intra-complex management network; and
a first circuit board to receive the first scan information from the on-board administration logic via the intra-complex management network based on a first circuit board address, the first circuit board comprising a first TBC, two or more first test access ports (TAPs) arranged in a first TAP chain confined to the first circuit board, and a first on-board scan programming (OSP) programmable component;
a second circuit board to receive the second scan information from the on-board administration logic via the intra-complex management network based on a second circuit board address, the second circuit board comprising a second TBC, two or more second TAPs arranged in a second TAP chain confined to the second circuit board, and a second on-board scan programming (OSP) programmable component,
the first TBC to produce a first set of JTAG OSP commands from the first scan information and to provide the first set of JTAG OSP commands to the first TAP chain to control OSP of the first OSP programmable component and the second TBC to produce a second set of JTAG OSP commands from the second scan information and to provide the second set of JTAG OSP commands to the second TAP chain to control OSP of the second OSP programmable component at least partially in parallel with the OSP of the first OSP programmable component.

2. The apparatus of claim 1, where the two or more circuit boards are to perform OSP substantially in parallel.

3. The apparatus of claim 2, where the first circuit board is to perform OSP independent of OSP performed on the second circuit board.

4. The apparatus of claim 1, wherein the first TBC is to be a host interface for the first TAP chain and at least one of the first TAPs is to be a slave interface for the first TAP chain.

5. The apparatus of claim 1, comprising a JTAG clock to clock the first TAP chain at a rate of at least 10 MHz.

6. The apparatus of claim 1, where the first scan information comprises control signals and data, where the control signals control how the first programmable component on the first circuit board is to be dynamically programmed with the data using OSP.

7. The apparatus of claim 6, where the first scan information includes encoded JTAG commands, and where the encoded JTAG commands are to be translated into JTAG commands by the first TBC.

8. The apparatus of claim 1, wherein the first programmable component comprising at least one of, a field programmable gate array (FPGA), a programmable read only memory (PROM), and a non-volatile memory.

9. The apparatus of claim 1, wherein the on-board administration logic comprises a software-controlled process or an application specific integrated circuit (ASIC).

* * * * *